US011908502B2

(12) United States Patent
Eppler et al.

(10) Patent No.: US 11,908,502 B2
(45) Date of Patent: Feb. 20, 2024

(54) PARTIAL PULSE PAIRING FOR IMPROVED READ SIGNAL QUALITY

(71) Applicant: Seagate Technology LLC, Fremont, CA (US)

(72) Inventors: Walter R. Eppler, Cranberry Township, PA (US); Drew Michael Mader, Shakopee, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 155 days.

(21) Appl. No.: 17/694,442

(22) Filed: Mar. 14, 2022

(65) Prior Publication Data

US 2023/0290398 A1    Sep. 14, 2023

(51) Int. Cl.
*G11C 16/10*    (2006.01)
*G11C 11/16*    (2006.01)
*H03M 1/06*     (2006.01)

(52) U.S. Cl.
CPC ...... *G11C 11/1673* (2013.01); *G11C 11/1675* (2013.01); *G11C 11/1677* (2013.01); *G11C 11/1693* (2013.01); *H03M 1/0636* (2013.01)

(58) Field of Classification Search
CPC ............ G11C 11/1673; G11C 11/1675; G11C 11/1677; G11C 11/1693; H03M 1/0636
See application file for complete search history.

(56) References Cited

U.S. PATENT DOCUMENTS

2014/0321195 A1* 10/2014 Antonyan ........... G11C 11/1697
                                                         365/148
2022/0165344 A1*  5/2022 Liu ..................... G11C 11/1655

* cited by examiner

*Primary Examiner* — Xiaochun L Chen
(74) *Attorney, Agent, or Firm* — HOLZER PATEL DRENNAN

(57) ABSTRACT

A method for reducing noise in a read signal due attributable to read element asymmetry provides for transmitting a write signal through a write precompensation circuit that shifts rising edges and falling edges of each of pulse in the write signal by a select magnitude and in opposite directions. After the write signal is encoded on a media, a corresponding read signal is read, with a read element, from the media. The method further provides for transmitting the read signal through a magnetoresistive asymmetry compensation (MRAC) block that is tuned to correct second-order non-linearities characterized by a particular set of distortion signatures. The select magnitude of the waveform shift applied by the write precompensation circuit introduces a non-linear signal characteristic that combines with non-linear signal characteristics introduced by the read element to generate one of the particular distortion signatures that is correctable by the MRAC block.

20 Claims, 9 Drawing Sheets

PARTIAL PULSE PAIRING FOR IMPROVED READ SIGNAL QUALITY

BACKGROUND

A read element interprets encoded data bits on a magnetic media by detecting magnetic flux emitted from those data bits and translating the flux read into an output voltage. Behavior of an ideal (noiseless) read element may be described by a linear transfer function between input flux and output voltage. However, real-world read elements are noisy and commonly exhibit non-linear behavior. This non-linear behavior is, in some cases, characterized as reader asymmetry, with more asymmetrical readers often exhibiting a poorer signal to noise ratio.

An asymmetrical read element does not have a linear transfer function. Instead, the transfer function exhibits second-order behavior and—in cases of highly asymmetrical readers—behavior that can be characterized by third, fourth, and higher order terms. Some storage drives implement read channel circuitry that is designed to adjust the individual voltages output by the read element such that the resulting translation between input flux and output voltage is characterized by a more linear relationship. These operations that attempt to linearize the transfer function of the read element are sometimes also referred to as operations that "linearize the read signal."

One common approach to "linearizing the read signal" is to transmit the read signal through a Magnetoresistive Asymmetry Compensation (MRAC) block that subtracts, from the read signal, a signal proportional to the square of the received read signal, which has the effect of removing second order characteristics from the signal. While this technique is effective for readers that exhibit relatively low degrees of asymmetry, it is less effective for more highly asymmetrical readers with transfer functions that are described by higher order terms, since these terms contribute signal characteristics that remain in the signal even after the second order characteristics have been removed. In addition to being less effective for more asymmetrical readers, this second order signal subtraction technique is also imperfect because it introduces excess noise into the read signal that arises from the squaring of the signal that is to be subtracted.

Still another technique known as "pulse pairing" attempts to linearize the read signal by introducing carefully selected timing shifts before data is written to the media. These carefully selected timing shifts in the write signal are, in theory, selected to "cancel out" the non-linear characteristics that are subsequently introduced into the signal by the asymmetry inherent in the read element. Current applications to this approach rely on a multi-parameter optimizations are extremely costly in terms of configuration time (e.g., during factory calibration) and not possible in many facilities due to dependence upon scarcely available hardware. Even in cases where this multi-parameter optimization can be successfully performed, this technique is still disfavored as compared to MRAC because it cannot be used to correct for a time-varying distortion in the signal, such as due to read-head misalignment.

SUMMARY

According to one implementation, a method reducing distortion in a read signal provides for transmitting a write signal through a write precompensation circuit that shifts rising edges and falling edges of pulses in the write signal by a select magnitude and in opposite directions. The method provides for writing the write signal with the shifted pulses to a storage media; reading, with a read element, a read signal corresponding to the written write signal, and transmitting the read signal through a magnetoresistive asymmetry compensation (MRAC) block, where the MRAC block is tuned to correct second-order non-linearities characterized by a particular set of distortion signatures in the signal. The select magnitude of the shift applied by the write precompensation circuit introduces a non-linear signal characteristic that combines with non-linear signal characteristics introduced by the read element to generate one of the particular distortion signatures that is correctable by the MRAC block.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTION

According to one implementation, the herein disclosed technology linearizes an output read signal by modifying the signal in a carefully selected manner on its way into the storage media such that, when the signal is read back from the storage media and passed through an Magnetoresistive Asymmetry Compensation (MRAC) block, the resulting signal is substantially free of the non-linearities attributable to higher order terms that the MRAC block would not typically be able to remove. In general, an MRAC block (discussed below) is very good at removing second order non-linearities characterized by a particular set of distortion signatures in a signal. The herein proposed technique uses a single parameter pulse pairing optimization, referred to herein as "partial pulse pairing" to identify a select predistortion to introduce to the write signal that is inbound for storage on the storage media. This predistortion is carefully chosen such that, when the outbound read signal is passed through the read element, the signal characteristic combines with signal characteristics introduced by the read element to generate one of the particular distortion signatures in the set of distortion signatures that is correctable by the MRAC block. As a result, the final signal is linearized better than in drives that employ MRAC alone.

In still further implementations, a calibration technique provides for dynamically measuring the signal characteristics introduced by a read element in a storage drive. If the signal characteristics satisfy a threshold similarity with one of the distortion signatures that is correctable by the MRAC block, the storage drive may be deployed in the field without performing the above-described single parameter pulse pairing optimization for write precompensation. Selectively skipping this optimization for read elements which are more symmetrical significantly shortens factory calibration times without a corresponding performance cost.

Even in drives with highly asymmetrical read elements, measuring the signal characteristics of the read element can reduce calibration time by facilitating identification of a starting value for the single parameter pulse pairing calibration that is sufficiently "close" to the optimum value such that the optimum value can be more quickly identified than in calibrations that sweep through a full range of possible values.

Figure 1:
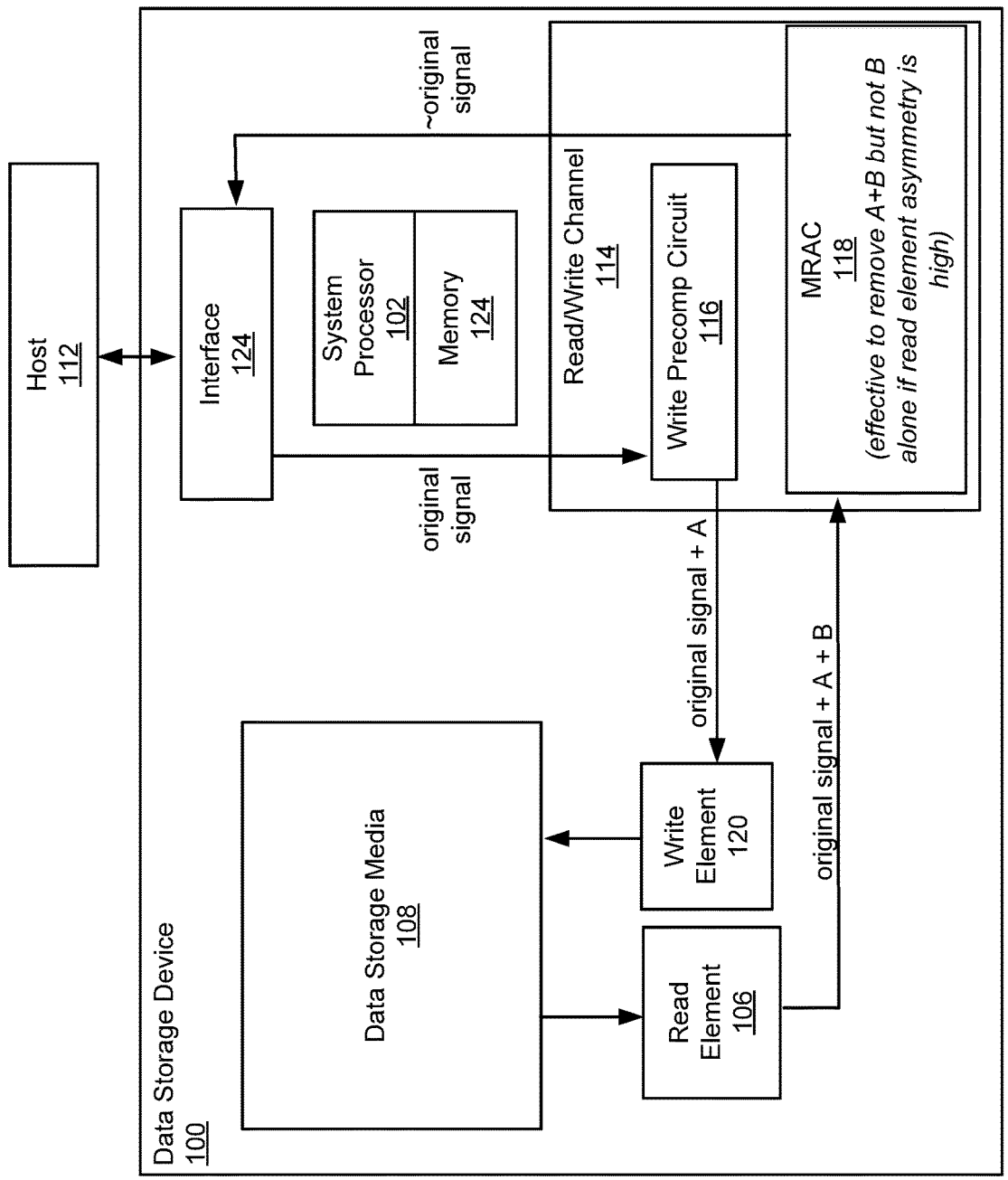
FIG. 1 illustrates a data storage device that uses a partial pulse pairing technique to linearize outputs of read element.

FIG. 1 illustrates a data storage device 100 that uses a partial pulse pairing technique to linearize outputs of read element 106. The data storage device 100 includes a system processor 102 for executing read and write commands received from a host device 112 across an interface 124. In one implementation, the system processor 102 is a microprocessor such as a system-on-chip (SOC) or application-specific integrated circuit (ASIC). The system processor 102 executes software elements (e.g., firmware) stored in memory 124, which may include volatile memory (e.g., RAM, DRAM, SRAM) and/or non-volatile memory (e.g., Flash).

The system processor 102 includes one or more tangible-computer readable storage media (e.g., storage media 108), such as a magnetic disk. As used herein, the term tangible computer-readable storage media refers to a device of manufacture and is explicitly defined to exclude freely-propagating communication signals, such as a carrier wave or other signal transport mechanism.

When executing read and write operations from the host 112, the system processor 102 generates and transmits control signals through the read/write channel 114, which includes a write precompensation circuit 116 and a magnetoresistive asymmetry compensation (MRAC) block 118, which operate in combination to linearize a read signal that is output by the read element 106. As used herein, a reader signal is "linearized" when the relationship between the range of input flux and output voltage is linear.

According to one implementation, a write signal encoding data bits is passed through the write precompensation circuit 116 on its way to a write element 120 that writes the data to the data storage media 108. The write precompensation circuit 116 applies a shift of predefined magnitude an opposite sign to rising and falling edges of each pulse in the write signal waveform. For example, the rising edges are shifted forward by a predetermined delta and the falling edge are shifted back by the same delta. These shifts in the waveform of predefined magnitude and opposite sign have the effect of encoding a non-linear signal characteristic— shown in FIG. 1 as "A"—on the inbound signal. The non-linear signal characteristic "A" may be understood as a carefully selected predistortion whose purpose is more apparent from the description below.

When the data is read back from the data storage media 108 by the read element 106, the read element 106 contributes additional non-linear signal characteristics "B" to the signal. The additional non-linear signal characteristics B are attributable to asymmetries in the read element 106. The read signal including the non-linearities A+B is then passed through the MRAC block 118.

In general, the MRAC block 118 is designed to remove second-order non-linearities from the read signal by subtracting off a signal that is proportional to the square of the received read signal. In cases where the additional non-linearities "B" added by the read element 106 are purely second-order, the MRAC block 118 may alone be fairly effective of removing the non-linearities "B" from the signal. However, in cases where the read element 106 exhibits greater inherent asymmetry, the non-linearities "B" added by the read element 106 are not purely second order and, in fact, are described by 4th order terms. In these storage devices, the MRAC block 118 is not alone sufficient to linearize the transfer function, meaning the output read signal is distorted.

To reduce the distortion in the signal output by the MRAC block 118, the non-linearities "A" are preselected by deliberate selection of the proportional shift that is applied by the write precompensation circuit 116. Specifically, the shift is select to generate the non-linear signal characteristics A such that the summation of the non-linear characteristic A (from the write precompensation circuit 116) and the additional non-linear signal characteristics B (from the read element 106) result in a signal with a distortion signature including A+B belonging to a family of distortion signatures characterized by second-order signal distortions that the MRAC block 118 is effective at removing. Consequently, the MRAC block 118 is more effective at removing A+B than B alone, and the signal that is output by the MRAC block 118 exhibits less distortion than it otherwise would in cases where the inbound write signal is not pre-distorted (by inclusion of "A") as described above.

Figure 2:
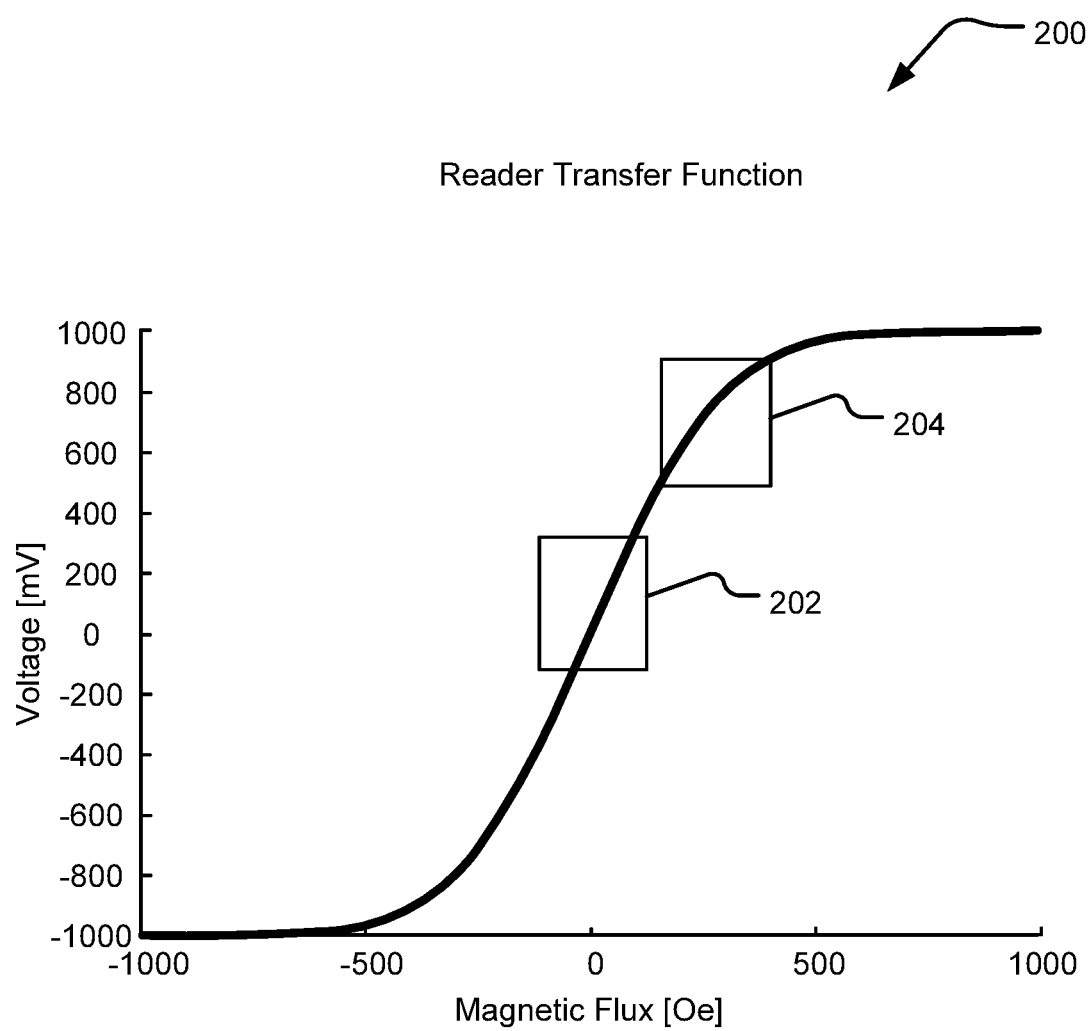
FIG. 2 illustrates an example transfer function of a read element.

FIG. 2 illustrates an example transfer function 200 relating an input flux range (x-axis) to an output voltage (y-axis). A read element that is ideal (very low asymmetry) may operate entirely in a first region 202 of the transfer function 200 where the output is essentially linear. A read element that exhibits more asymmetry may operate in in a second region 204 of the transfer function 200 where the output is less linear.

In general, an MRAC block is effective at linearizing the transfer function of a read element in a perfectly second order system, such as a read element that operates in the second region 204. However, the signal corrections implemented by the MRAC block do not remove characteristics attributing to terms that are higher than second-order. Therefore, an MRAC block would not alone be effective at linearizing the transfer function of a read element operating in the second region 204 if the deviation from linear are large. Consequently, the read channel in such a device may output a read signal that is more distorted than a read signal output by a device with a more symmetrical read element. In mathematics, a Volterra series may be used to describe a point on the transfer function 200. Essentially, a Volterra series is summation of terms of different orders that can approximate a dynamic, non-linear, time-invariant system with memory at a given point in time.

Different terms in the Volterra series contribute to known types of non-linear signal characteristics, completely described by each terms Volterra kernel or "Volterra echo" or echo for short These echoes create distortion in the read signal. A Volterra series approximating points in the second region 204 of the transfer function 200 includes a second order term and may also include higher order terms. These terms and their effect on the read signal are discussed in greater detail with respect to FIG. 3, below.

Figure 3:
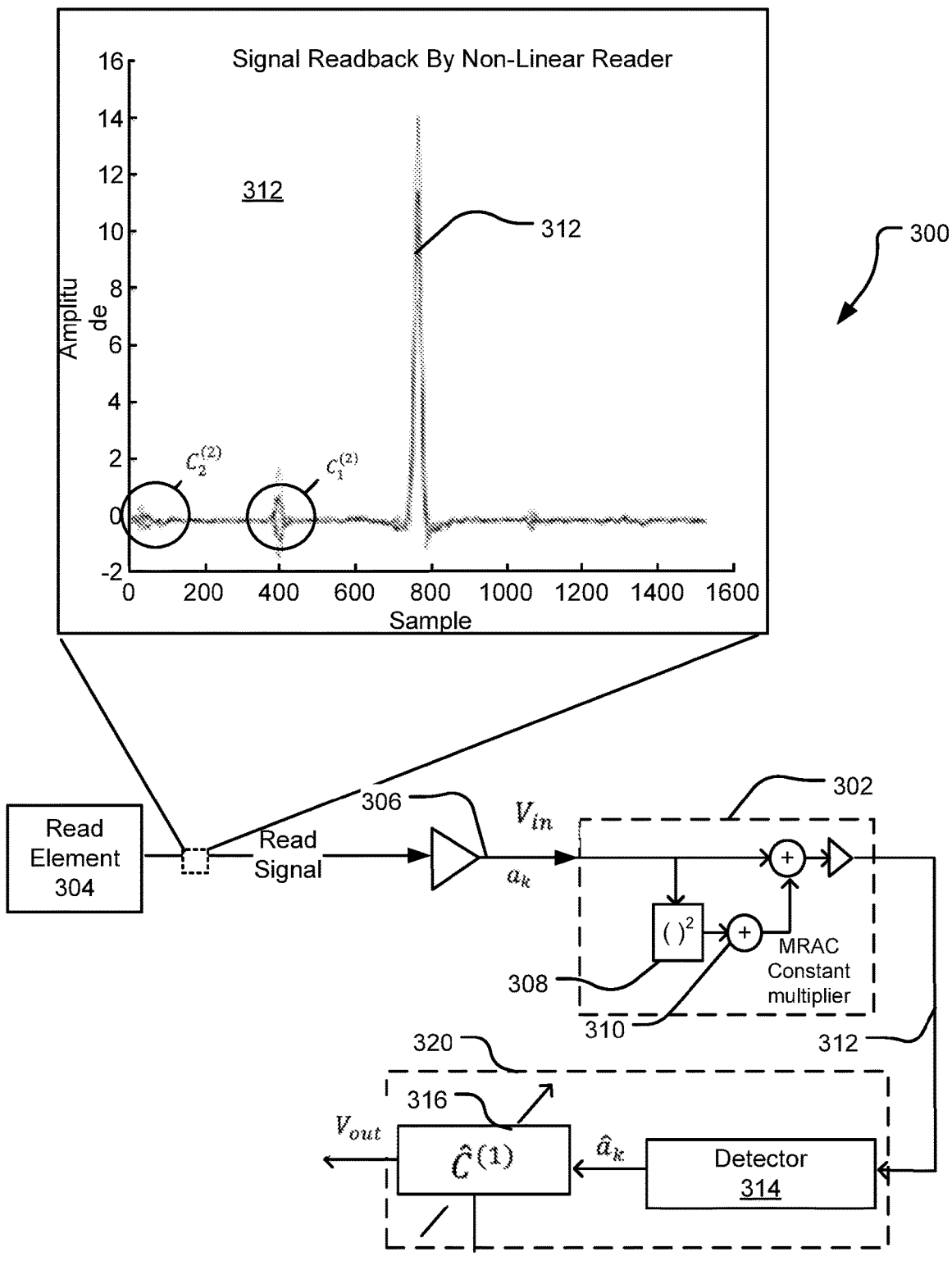
FIG. 3 illustrates an example of the type of signal characteristics that can be effectively removed by a magnetoresistive asymmetry compensation (MRAC) block 302 in a read channel of a storage device.

FIG. 3 illustrates an example of the type of signal characteristics that can be effectively removed by an MRAC block 302 in a read channel 300 of a storage device. The MRAC block 302 performs operations that help to linearize the transfer function of a read element 304.

The MRAC block 302 receives an input signal 306 from the read element 304 and splits the signal into a first component and a second component. The MRAC block 302 squares the first component (at subblock 308) and multiplies the output by a constant (e.g., a constant with a value between −1 and 1) at subblock 310 before adding it back on to the second component. This has the effect of subtracting off a portion of the signal that is proportional to the square of the signal received. During a calibration process, a sweep is performed to test a range of values for the constant multiplier in the subblock 310. This constant in the MRAC block 302 is selected to be a value that ensures the minimal number of errors at the output of the detector 314.

After passing through the MRAC block 302, the resulting signal is fed to the reference system 320 that includes a detector 314 that generates an estimate of the original sequence $\hat{\alpha}_k$. In one implementation, the detector 314 is a Viterbi detector that implements a soft output Viterbi Algorithm (SOVA engine) and a decoder that implements a decoding scheme such as a low-density parity check (LDPC) or the Reed-Solomon (RS) code. During each recovery attempt on a different sample read from the media, the Viterbi detector iterates back and forth cyclically with the decoder to estimate a likelihood that the corresponding bit is a one or a zero. This value (e.g., the best guess as to the value of the corresponding bit) is output by the bit detector 314 as $\hat{\alpha}_k$.

In the illustrated implementation, the output of the detector 314 is input to a finite impulse filter (FIR) 316. The FIR 316 includes tap coefficients found by minimizing the mean square error of the difference between the received waveform Vin[ ] and the filter output. The output of the FIR filter 316 is, in FIG. 3, represented by $V_{out}$, which may be understood as being the response of the reference system that is free of interference, distortions and noise (where the reference system includes both the detector 314 and FIR 316). It is this output ($V_{out}$) that is compared to the received signal in order to define the distortions in the read signal Vin[ ].

Under mild conditions on the continuity of the received waveform and its derivatives, as long as the system exhibits finite memory, the read signal Vin[ ], can be described by a finite Volterra. Series.

$$V_{in}[mT_s] =$$

$$y^{(0)}[mT_s] + \sum_k a_k C^{(1)}[mT_s - kT_b] + \sum_k \sum_{d_1}^{L-1} a_k a_{k-d_1} C_{d_1}^{(2)}[mT_s - kT_b] + \ldots +$$

$$\sum_k \sum_{d_1}^{L-1} \cdots \sum_{d_{l-1}+1}^{L-l-1} a_k a_{k-d_1} \cdots a_{k-d_l} C_{d_1 \cdot d_2 \cdots d_l}^{(l)}[mT_s - kT_b] + \text{noise}[mT_s]$$

where $T_s$ is the sampling period, $T_b$ the bit period and $C_{d_{il}}^{(i)}$ the $i^{th}$ order Volterra Kernel with delay $d_{il}$.

When the read signal sampled at $V_{in}$ is subtracted from the reference signal observed at $V_{out}$, the result is referred to as a residual, which includes distortions and noise. As used herein, "noise" refers to a random component (both additive and/or multiplicative) of the received waveform, with or without distortions, that remains after the reference signal Vout[ ] 314 has been subtracted from the waveform In contrast to noise, "distortions" refer to the deterministic undesired response (linear and/or non-linear) of the system to the magnetic transitions in the media quantifiable only by the comparison to the deterministic response of the specific reference system.

The above referenced residual ($V_{in}-V_{out}$) is given by the following Volterra series:

$$r[k] = y^{(0)}[k] + \sum_k (a_k - \hat{a}_k) C^{(1)}[kT_b] +$$

$$\sum_k a_k \left( C^{(1)}[kT_b] - \hat{C}^{(1)}[kT_b] \right) + \sum_k \sum_{d_1}^{L-1} a_k a_{k-d_1} C_{d_1}^{(2)}[kT_b] + \ldots +$$

$$\sum_k \sum_{d_1}^{L-1} \cdots \sum_{d_{l-1}+1}^{L-l-1} a_k a_{k-d_1} \cdots a_{k-d_l} C_{d_1 \cdot d_2 \cdots d_l}^{(l)}[kT_b] + \text{noise}[kT_b]$$

In this equation for the residual, the first term on the right hand side of the equal sign is the DC content of the received waveform. The second term is the error response (which vanishes if $\alpha_k = \hat{\alpha}_k$). The third term is the linear distortion which vanishes if $C^{(1)} = \hat{C}^{(1)}$ and all the other terms involving various products of the bit sequence and its delays is the nonlinear distortion, or neglecting the linear distortion, just the distortion response of the system. The foregoing is important because it illustrates the terms that remain even after the MRAC block 302 has removed second order non-linearities from the signal.

Figure 6:
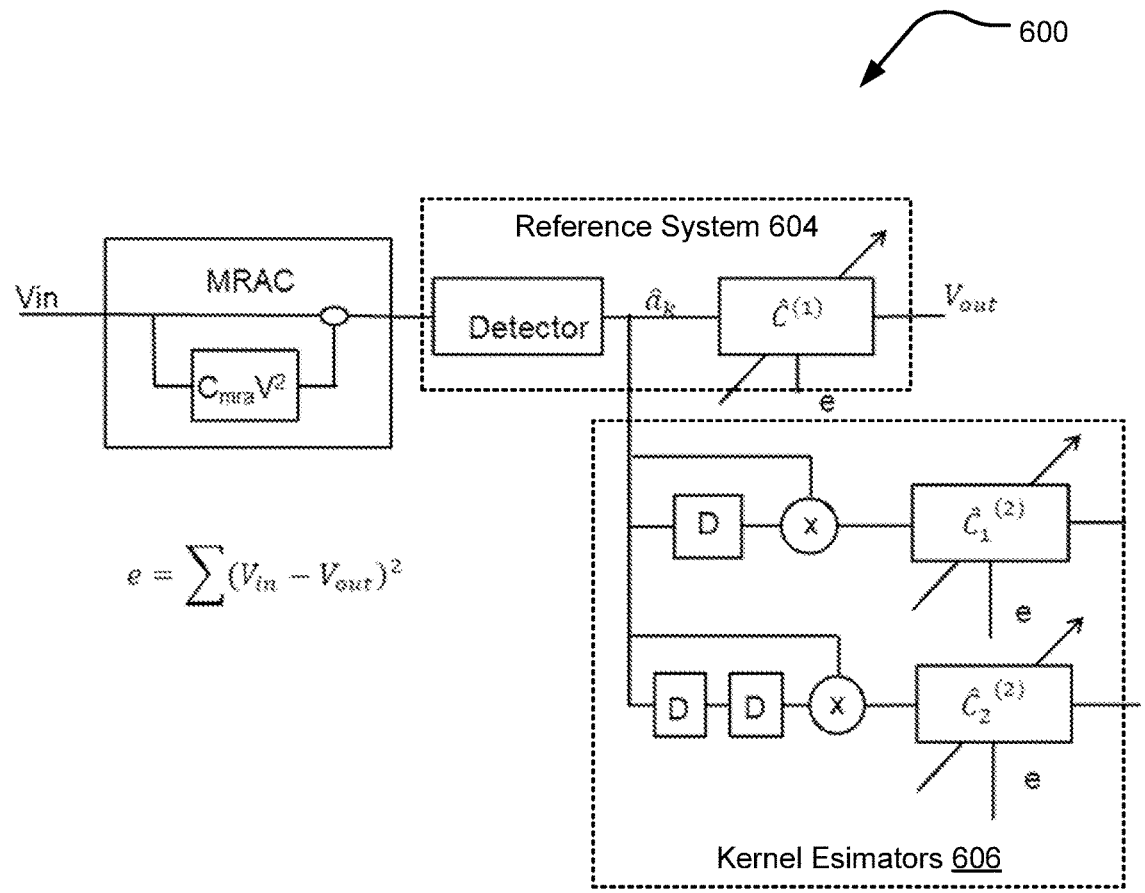
FIG. 6 illustrates an example read channel including hardware capable of measuring the largest second order kernels in a Volterra model of a read signal.

In general, higher order terms in the Volterra series contribute different characteristics to the read signal described by each term's Volterra Kernel $C_{d_l}^{(i)}$ or "Volterra echo". When the read element 304 is highly asymmetrical, the Volterra series describing the residual ($V_{in}-V_{out}$) includes second order terms and higher order terms as well. In a fashion similar to the generation of the reference system, using the estimated sequence out of the detector $\hat{\alpha}_k$, a small amount of logic and the addition of two additional adaptive FIR filters, the two second order kernels with the shortest delays $C_1^{(2)}$ and $C_2^{(2)}$ can be estimated by adapting the coefficients of these filters to minimizing the mean square difference of the received waveform minus the sum of reference system and these two filter outputs as shown in FIG. 6 An example of estimating the pulse response of these kernels along with pulse response of the reference system is shown in plot 312.

If a Volterra model for the MRAC bloc is truncated after the second order terms, it includes two key second order $C_1^{(2)}$ and $C_2^{(2)}$ kernels, defined as follows:

$$C_1^{(2)} = c * a_k * a_{k-1} * C^{(1)}(t) * C^{(1)}(t-1T)$$

$$C_2^{(2)} = c * a_k * a_{k-2} * C^{(1)}(t) * C^{(1)}(t-2T)$$

where c is a constant representing the relative degree of asymmetry correction of the MRAC block 302. Thus, the MRAC block 302 can scale these two kernels simultaneously but it cannot change their relative amplitudes. When these two kernels in the received signal have the expected relative ratio then the residual distortions will approach zero and the MRAC block will have linearized the system. However, if these kernel's relative ratio in the received signal are not in the expected ratio, the MRAC output of the MRAC block will contain residual second order distortions and the system will not be fully linearized.

In the herein disclosed systems, partial pulse pairing may be optionally employed (e.g., for more highly asymmetrical read elements) to introduce a non-linear signal characteristic that essentially alters the amplitude of the $C_1^{(2)}$ echo without substantially modifying the amplitude of the $C_2^{(2)}$ echo. By carefully selecting the magnitude of pulse shifts implemented by a write precompensation block (e.g., write precompensation circuit 116 in FIG. 1), one may controllably alter the amplitude of the $C_1^{(2)}$ echo and thereby deliberately set the amplitude ratio of the $C_1^{(2)}$ to $C_2^{(2)}$ to be consistent with one of the ratios in the group of amplitude ratios (distortion signatures) that the MRAC block 302 is capable of correcting.

Figure 4:
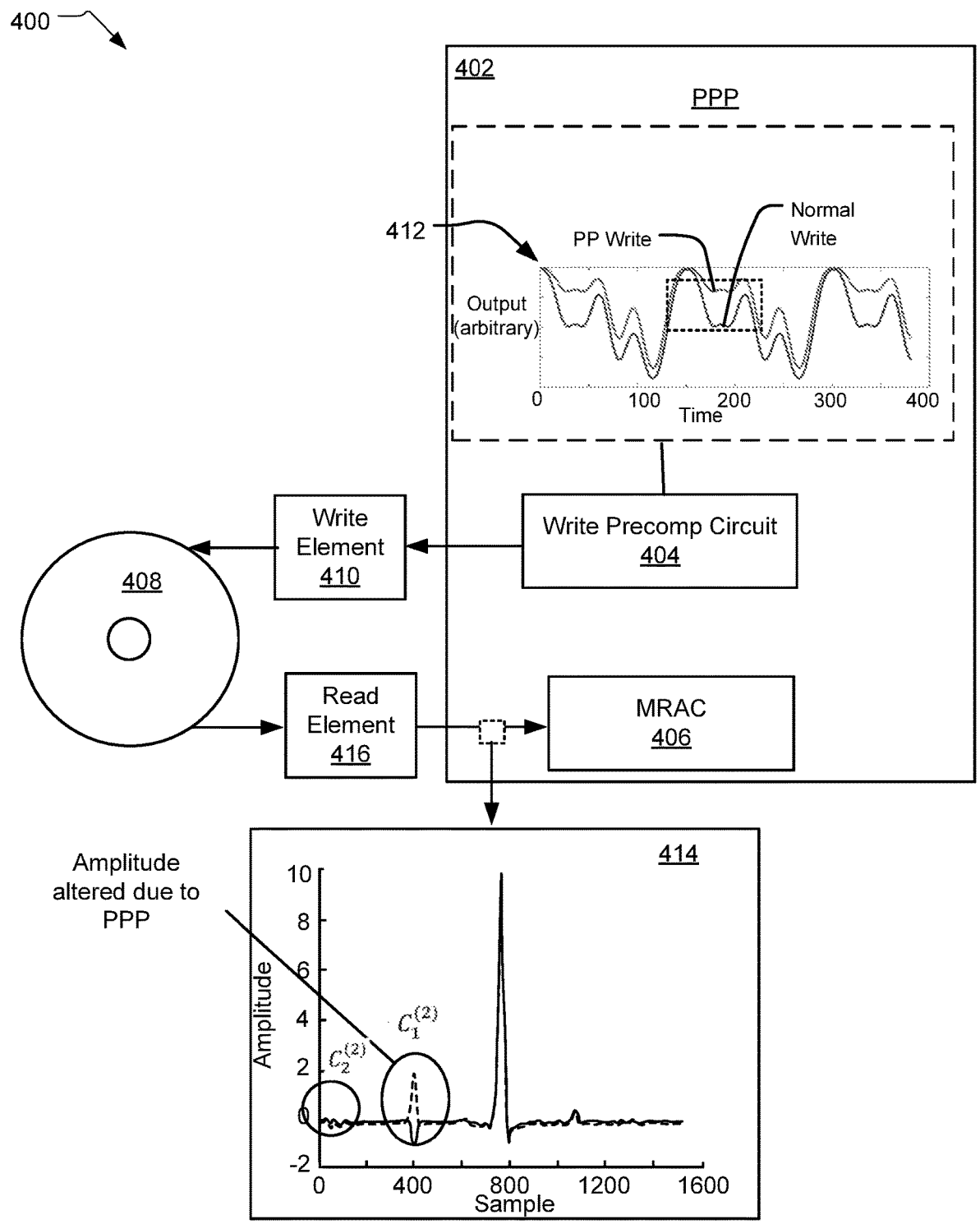
FIG. 4 illustrates aspects of another data storage device that uses a partial pulse pairing technique to linearize a read signal output by the data storage device.

FIG. 4 illustrates aspects of another data storage device 400 that uses a partial pulse pairing technique to linearize a read signal output by the data storage device 400. The data storage device 400 includes a read/write channel 402 with a write precompensation circuit 404 and an MRAC block 406. The write precompensation circuit 404 is tuned, through a partial pulse pairing (PPP) calibration, to add a non-linear signal characteristic to a write signal that is in route to a write element 410 that, in turn, writes the signal to a storage media 408. As discussed above with respect to FIG. 3, this non-linear signal characteristic is, in one implementation, a component of the $C_1^{(2)}$ Volterra echo.

The write precompensation circuit 404 adds the non-linear signal characteristic to the ingoing write signal by shifting opposing edges of the write current waveform 412 in opposite directions by a select delta. Rising edges of the waveform 412 are shifted in the positive direction by the select delta while falling edges of the waveform 412 are shifted in the negative direction by the select delta.

In one implementation, the magnitude of the waveform shift (delta) is selected during a partial pulse pairing calibration, described below. Here, "partial" refers to the fact that a single parameter is optimized by the calibration (e.g., the delta value). As noted elsewhere herein, previously employed pulse pairing techniques shift the rising and falling edges of the waveform by different amounts and in ways that are intended to cancel reader-introduced non-linearities. In contrast, the approach of FIG. 4 applies a shift of uniform magnitude and opposite direction to both rising and falling edges of the write pulse to introduce a non-linear signal characteristic. This introduced non-linear signal characteristic combines with non-linear signal characteristics added to the signal by the asymmetry of the read element so as to ensure that the resulting signal exhibits distortion characteristics that the MRAC block 406 is adapted to effectively remove—e.g., distortions consistent with those observed when the read signal can be completely described by first and second order terms of the Volterra series.

The inbound signal written to the media 408 by the write element 410 therefore includes a non-linear signal characteristic that is controllably selected, by setting the 2) magnitude of the waveform shift (delta), to contribute a given amount to the $C_1^{(2)}$ Volterra echo discussed above with respect to FIG. 3 and plot 312. When a read element 416 subsequently reads the signal back from the media 408, further non-linear signal characteristics are introduced. These non-linear signal characteristics primarily include $C_1^{(2)}$ and $C_2^{(2)}$ echo components (as discussed above) as shown in plot 414 that are attributable to asymmetries of the read element 416. Thus, the amplitude of the $C_2^{(2)}$ echo is effectively attributable to the non-linear signal characteristics introduced by the read element 416 and by the non-linear signal characteristics resulting from the shift in the ingoing waveform applied by the write precompensation circuit 404, which is controllably set by the select magnitude of the waveform shift (delta).

As mentioned elsewhere herein, the MRAC block 302 is very effective at removing signal non-linearities characterized by a set of particular distortion signatures. Specifically, the MRAC block 302 is effective at removing the $C_1^{(2)}$ and $C_2^{(2)}$ echoes when the two echoes have an amplitude ratio that is characteristic of a purely second order system.

Figure 5:
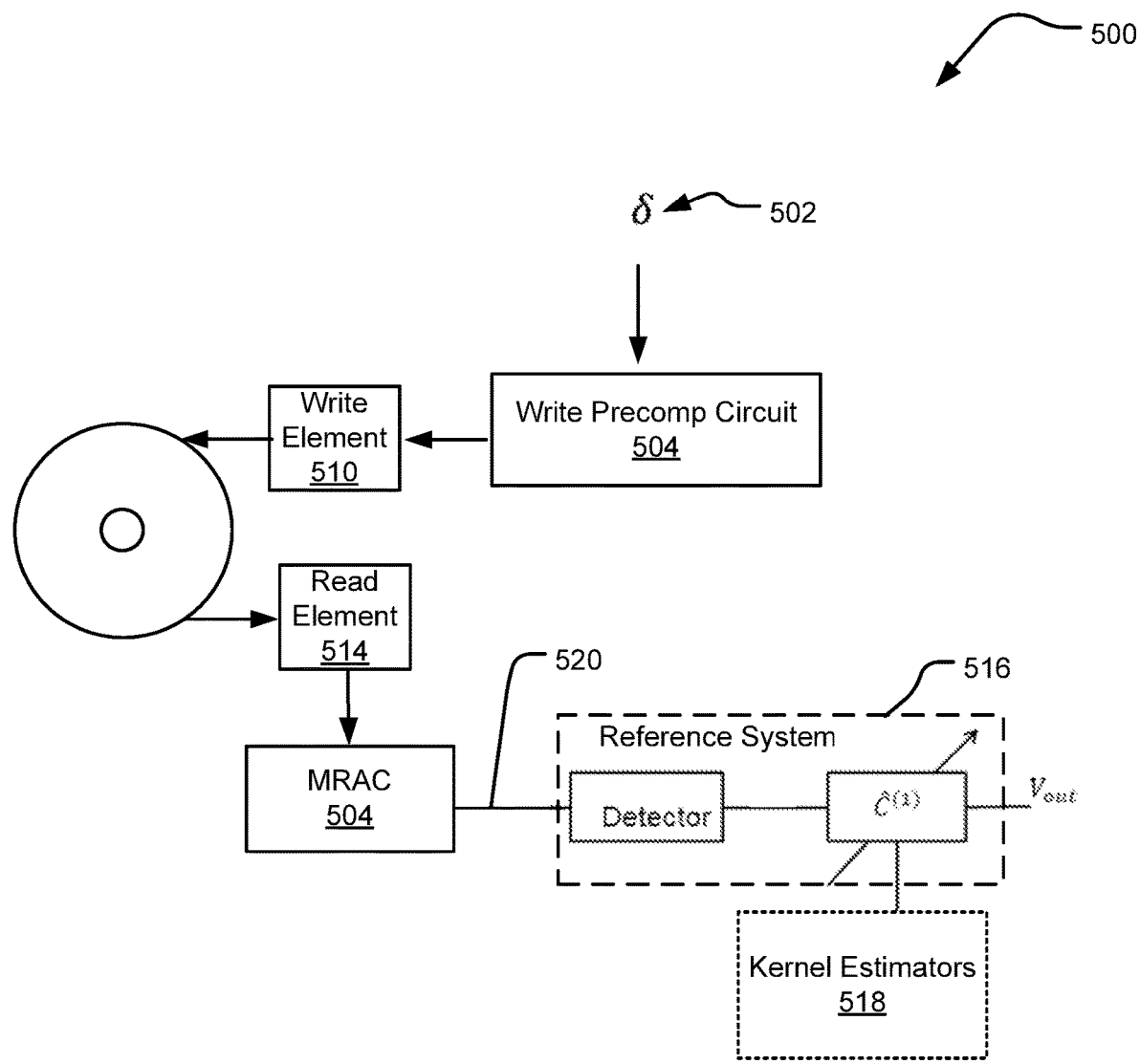
FIG. 5 illustrates aspects of a partial pulse pairing calibration.

FIG. 5 illustrates aspects of a partial pulse pairing calibration 500 within a system including features described above with respect to FIG. 4. During the partial pulse pairing (PPP) calibration, the shift magnitude 502 (delta) of a write precompensation circuit 504 is controllably altered to sweep through each value in a defined range with the goal of introducing a corresponding amplitude change in the $C_1^{(2)}$ echo of the signal written by a write element 510 that is effective to alter the amplitude ratio of the $C_1^{(2)}$ and $C_2^{(2)}$ echoes of the signal output by the read element 514 such that the resulting amplitude ratio of the $C_2^{(2)}$ and $C_1^{(2)}$ echoes is, at point $V_{in}$ of FIG. 5, characteristic of a purely second order system. When the optimal value of the shift magnitude 512 is identified, the distortions due to the $C_1^{(2)}$ and $C_2^{(2)}$ echoes can be effectively canceled from the read signal by an MRAC block 508.

In one implementation, the PPP calibration entails (1) controllably setting the shift magnitude 512 to a select value in a defined range; and (2) measuring a difference between a signal 520 output from the MRAC block 504 and a signal output from a reference system 516 in the read channel, where the reference system 516 estimates a linear model of the signal that was written to the media. These steps may be repeated for each value of the shift magnitude within a select range of values to identify the shift magnitude that minimizes the residual. This shift magnitude is then selected and set within the write precompensation circuit 404 before the storage drive is deployed for use in the field (e.g., by an end user).

In some storage drives, the reference system 516 may include Volterra kernel estimators 518 that includes hardware that is capable of measuring the $C_1^{(2)}$ and $C_2^{(2)}$ echoes in a Volterra model of the read signal that is output by the read element 514. In these storage drives, the kernel estimators 518 may be used perform a measurement that saves significant time during factory calibrations. For example, the kernel estimators 518 may measure the $C_1^{(2)}$ and $C_2^{(2)}$ echoes in a Volterra model of the read signal output by the read element 514 (e.g., as shown) prior to the partial pulse pairing (PPP) calibration. When the system closely resembles a second-order Volterra model, the measured $C_1^{(2)}$ and $C_2^{(2)}$ echoes have an amplitude ratio within a prescribed tolerance of the expected ratio. In this case, it is more likely that the storage device may perform acceptably well (e.g., outputting a read signal with a bit error rate within accepted limits) using MRAC alone and without the partial pulse pairing adjustment to the inbound signal. In this way, the kernel estimators may facilitate identification of read elements that are less likely to benefit from the PPP calibration such that the PPP calibration may be skipped in this subset of read elements, saving significant factory calibration time.

Moreover, using the kernel estimators 518 to measure the $C_1^{(2)}$ and $C_2^{(2)}$ echoes of the read signal can further save calibration time by allowing a human operator or automated calibration controller to quickly identify a starting value for the magnitude of the waveform shift in the PPP calibration that is reasonably close to the optimum value. For instance, a look-up table may correlate various amplitude ratios of the measured $C_1^{(2)}$ and $C_2^{(2)}$ echoes with preselected corresponding values or ranges for the PPP shift.

In yet another implementation, the kernel estimators 518 are employed in-the-field to periodically re-calibrate the drive so as to update stored values in the MRAC block 504 (e.g., the constant multiplier in subblock 310 of FIG. 3) and/or the magnitude of the waveform shift applied by the write precompensation circuit 504. For example, optimum values for the MRAC block multiplier and/or the PPP waveform shift may be predetermined and stored in a lookup table such that the drive can periodically "turn off" the PPP and MRAC adjustment, re-measure the amplitude ratio of the $C_1^{(2)}$ and $C_2^{(2)}$ echoes in the Volterra model of the read signal (e.g., arising from the read element asymmetry), and select updated values for the MRAC block multiplier and/or the PP waveform shift that provide a best signal to noise ratio in the outgoing read signal. This ability to dynamically re-set values for the MRAC block multiplier and/or the PP waveform shift may reduce performance degradation of the storage device that would otherwise occur due to changes in reader asymmetry that occur as the reader ages, such as due to wearing of the reader from repeated contact with the disk.

FIG. 6 illustrates an example read channel 600 including hardware capable of estimating the kernels in a Volterra model of a read signal. The read channel 600 includes the same or similar hardware as that described with respect to any of FIG. 1-5, including an MRAC block 602 and a reference system 604. The kernel estimators 606 includes two additional adaptive FIR filters driven by products of the detector output and its delays of one and two bits. Using the minimum mean square error to adapt these filters one has available estimators of the delay one and delay two second order Volterra Kernels $C_1^{(2)}$ and $C_2^{(2)}$.

Figure 7:
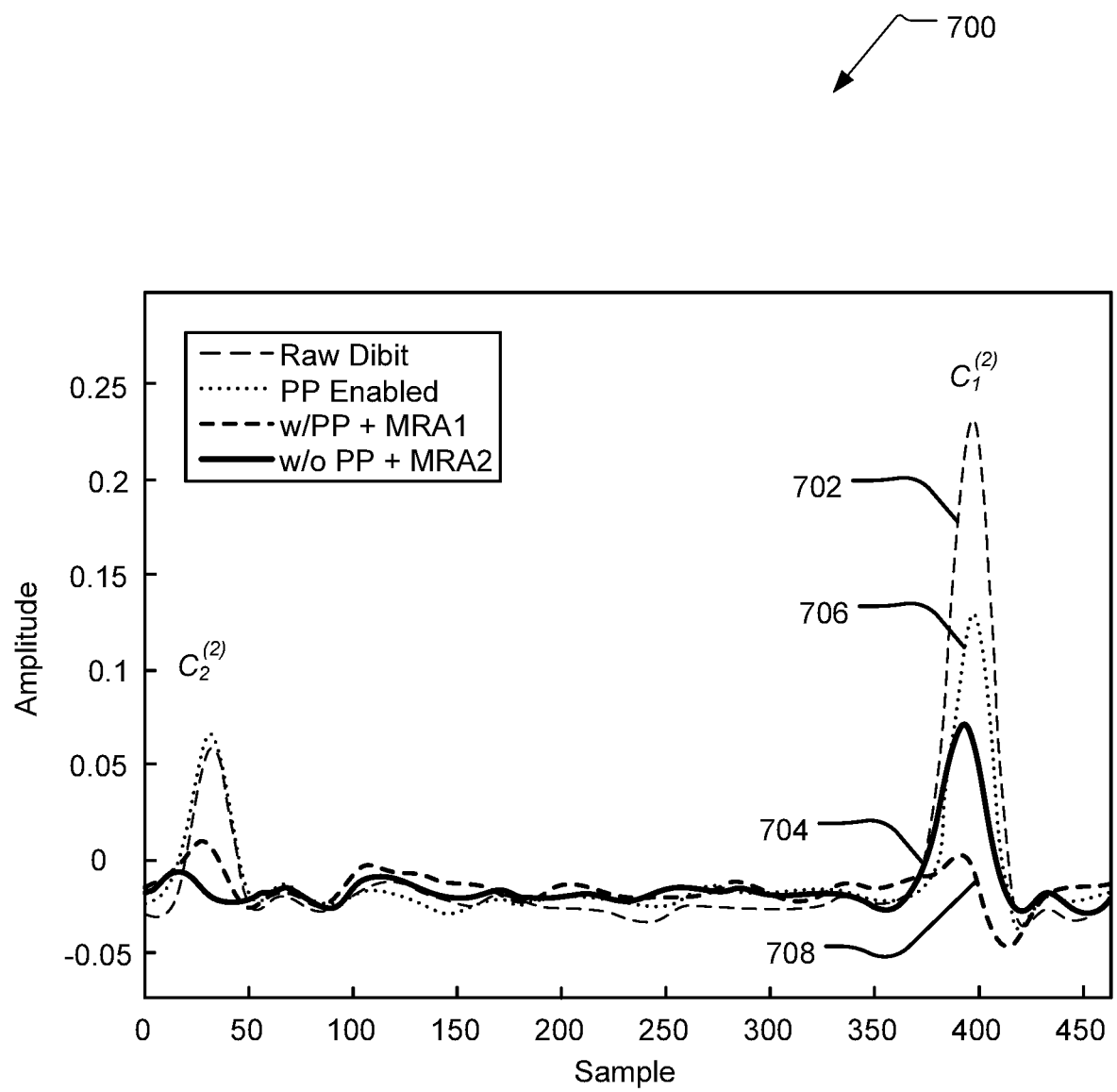
FIG. 7 illustrates a plot showing how the herein proposed techniques effectively reduce distortion in the read signal that is introduced due to asymmetries of a read element

FIG. 7 illustrates a plot 700 showing how the herein proposed techniques effectively reduce distortion in the read signal that is introduced due to asymmetries of a read element. When the read element is non-linear, the read signal read back from the media includes distortions due to the $C_1^{(2)}$ and $C_2^{(2)}$ echoes in a Volterra model of the read signal waveform (e.g., as shown in FIG. 3).

A first line 702 on the plot 700 indicates a raw read signal read sample read from an asymmetrical read element. The read signal sample includes the undesirable $C_1^{(2)}$ and $C_2^{(2)}$ Volterra echoes (distortion). A second line 704 illustrates a corrective effect that can be observed when the read signal is transmitted through an MRAC block (without applying the herein-disclosed PPP technique for write precompensation to the ingoing write signal). As shown, the MRAC block can only modify the amplitude of the $C_1^{(2)}$ and $C_2^{(2)}$ echoes simultaneously in a fixed ratio. A third line 706 illustrates an effect of the partial pulse pairing write precompensation technique alone (without transmitting the outgoing signal through an MRAC block). This illustrates that the PPP technique can control the amplitude of the $C_1^{(2)}$ echo without significantly affecting the $C_2^{(2)}$ echo.

A fourth line 708 illustrates a combined effect of the disclosed PPP technique for write precompensation and MRAC for the outgoing read signal. As shown, the PPP technique controls the amplitude of the $C_1^{(2)}$ echo so as to allow for tuning of an amplitude ratio of the two echoes that is known to be correctable by the MRAC block. Consequently, the echoes are substantially removed in this signal.

Figure 8:
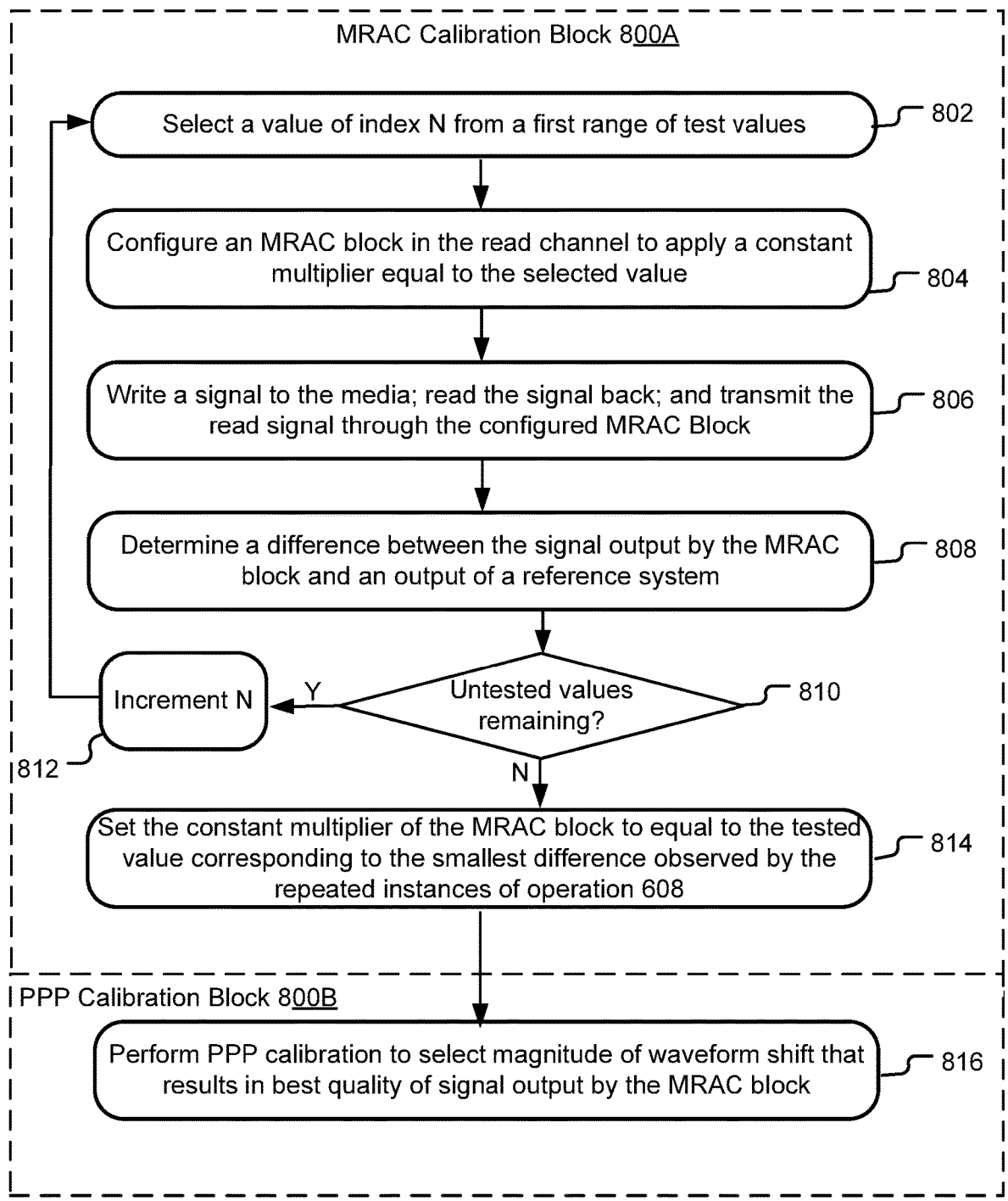
FIG. 8 illustrates example operations for calibrating a storage drive to correct distortions due to read signal asymmetry.

FIG. 8 illustrates example operations for calibrating a storage drive to correct distortions due to reader asymmetry. A first block of operation 800A provide steps for calibrating a selectable parameter of an MRAC block. The MRAC block is a circuit in the read/write channel that subtracts, from a received read signal, a signal proportional to the square of the read signal. This signal subtracted is the read signal squared multiplied by a constant. This constant, the "MRAC constant multiplier" is the value selected through select operations 700A.

Notably, some implementations of the disclosed technology may allow for skipping many of the operations 800A by performing an initial measurement of echoes in a Volterra model of a read signal. In one implementation where the $C_1^{(2)}$ echo and the $C_2^{(2)}$ echo are measured directly, the MRAC constant multiplier may be retrieved from a lookup table. In implementations that, for example, lack hardware to measure the $C_1^{(2)}$ echo and the $C_2^{(2)}$ echoes, the MRAC constant multiplier is selected by the operations 800A.

Specifically, a selection operation 802 selects a value of index N from a range of test values. A configuration operation 804 configures the MRAC block to subtract, from the read signal, the square of the read signal multiplied by the MRAC constant multiplier. A write and readback operation 806 writes a signal to the media, reads the signal back from the media, and transmits the read signal through the configured MRAC block. A determining operation 808 determines a difference between a signal output by the MRAC block and a signal output by a reference system within the read channel that estimates a linear model for the received signal (e.g., an estimate of the original signal written to the media).

A determination operation 810 determines whether there are any values in the range of test values yet to be subjected to the operations 802 through 808. If so, an incrementation operation 812 increments N and the operations 802 through 808 repeat until all values in the test range have been tested. A final MRAC block configuration operation 814 configures the MRAC block constant multiplier to equal the tested value that corresponds to the smallest difference observed in the determination operation 808.

After setting the MRAC block constant multiplier as described by the operations 800A, the operations 800B begin, commencing a perform a partial pulse pairing (PPP) calibration. This calibration entails a single-parameter optimization, where the single parameter optimized is a shift magnitude that is applied by a write precompensation circuit to shift rising and falling edges of a write pulse waveform in opposite directions. According to one implementation, the selected shift introduces a non-linear signal characteristic that combines with non-linear signal characteristics introduced by the read element to generate a particular distortion signature that is more correctable by the MRAC block than the non-linear signal characteristics introduced by the read element alone Specific suboperations of the PPP calibration are discussed in further detail with respect to FIG. 9.

Figure 9:
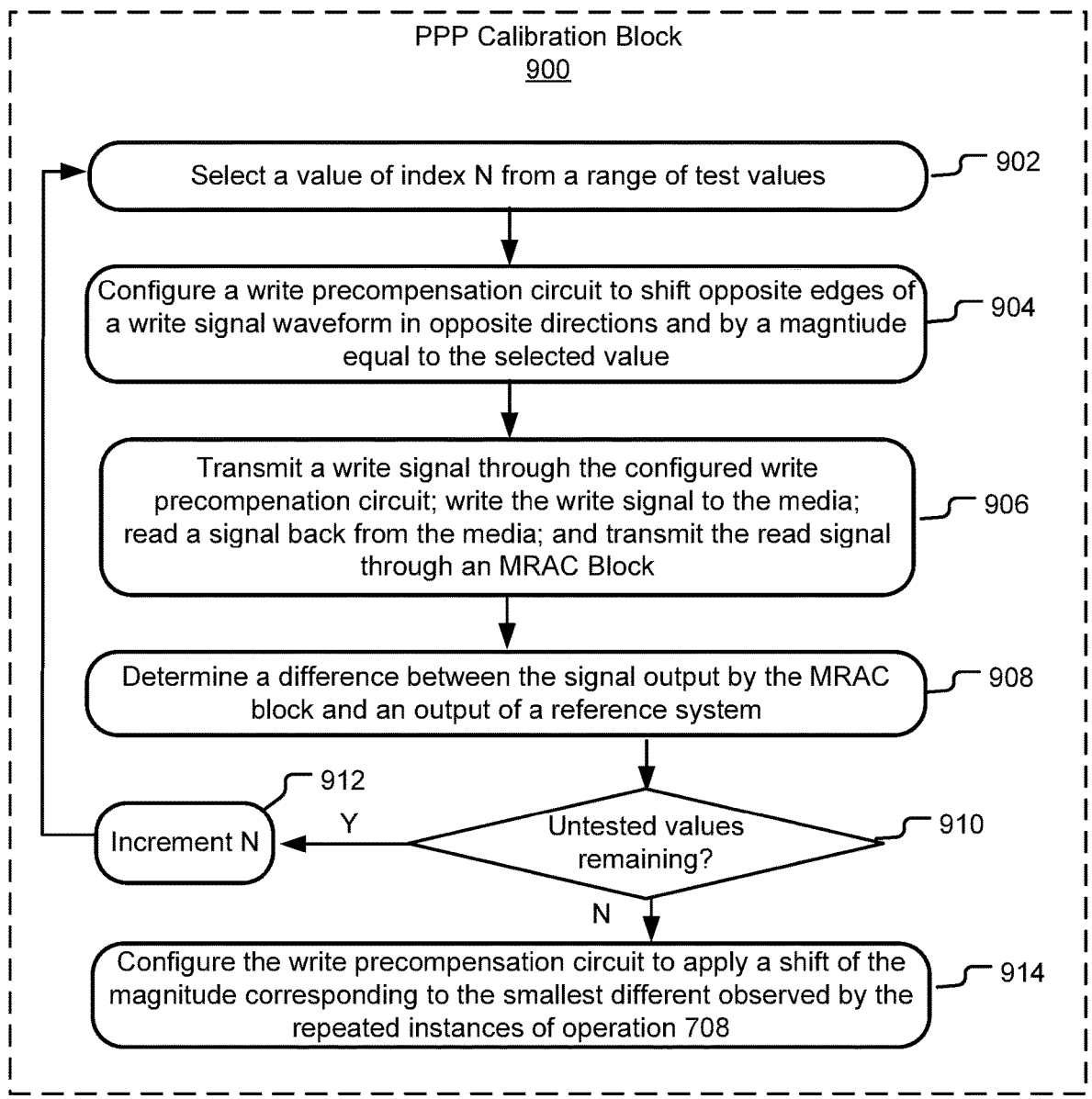
FIG. 9 illustrates example operations of a partial pulse pairing calibration that is used to select a waveform shift applied by a write precompensation circuit in a manner consistent with other figures described herein.

FIG. 9 illustrates example operations 900 of a PPP calibration that is used to select a waveform shift applied by a write precompensation circuit in a manner consistent with other figures described herein. In one implementation, the operations 900 are sub operations of the PPP calibration block 800B of FIG. 8.

A selection operation 902 selects a value of index N from a range of test values. A configuration operation 904 configures a write precompensation circuit to shift opposite edges of each pulse in a write signal waveform in opposite directions and by a magnitude equal to that selected by the selection operation 902. A test operation 906 transmits a write signal through the configured write precompensation circuit, writes the write signal to a storage media, reads a corresponding signal back from the storage media, and transmits the read signal through an MRAC block that is calibrated in advance of the operations 900 (such as in accord with the operations described above with respect to FIG. 6). A determination operation 908 determines a difference between the signal output from the MRAC block and a signal output by a reference system in the read channel, where the reference system estimates a linear model for the received signal (e.g., a best estimate of what the ingoing write signal was before being distorted by the write precompensation circuit).

Another determination operation 908 determines whether there are any values in the range of test values yet to be subjected to the operations 802 through 808. If so, an incrementation operation 910 increments N and the operations 902 through 908 repeat until all values in the test range have been tested. A final write precompensation circuit configuration operation 914 configures the write precompensation circuit to apply shift of a selected magnitude, where the selected magnitude corresponds to the test value that yielded the smallest difference observed by in the determination operation 908.

In at least one implementation, the selection of the magnitude of the waveform shift is influenced by an initial measurement of non-linear noise characteristics in the read signal. For example, an amplitude ratio of measured $C_1^{(2)}$ and $C_2^{(2)}$ echoes can be used either to retrieve either an optimal value for waveform shift or, instead, to identify a subset of the range of test values (e.g., a fairly close "starting guess") on which to perform the operations 802 through 808.

In at least one implementation, the operations 900 are selectively skipped when an initial measurement of the $C_1^{(2)}$ and $C_2^{(2)}$ echoes is consistent with predefined criteria indicating that the MRAC block alone is sufficient to remove non-linearities from the read signal. If, for example, the read element exhibits a low degree of asymmetry, the non-linearities in the read signal may be entirely second order non-linearities. In this case, an amplitude ratio of the $C_1^{(2)}$ and $C_2^{(2)}$ echoes will match (or nearly match) a select amplitude ratio in a class of $C_1^{(2)}$ and $C_2^{(2)}$ amplitude ratios corelating with pairs of echoes that the MRAC block is effective at removing from the read signal.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

What is claimed is:

1. A method of reducing distortion in a signal read from a storage device, the method comprising:
   transmitting a write signal through a write precompensation circuit that shifts rising edges and falling edges of each pulse in the write signal by a select magnitude and in opposite directions;
   writing the write signal output by the precompensation circuit to a storage media;
   reading, with a read element, a read signal corresponding to the written write signal; and
   transmitting the read signal through a magnetoresistive asymmetry compensation (MRAC) block, the MRAC block being tuned to correct second-order non-linearities characterized by a particular set of distortion signatures, wherein the select magnitude of the shift applied by the write precompensation circuit introduces a non-linear signal characteristic that combines with non-linear signal characteristics introduced by the read element to generate one of the particular distortion signatures that is correctable by the MRAC block.

2. The method of claim 1, wherein the non-linear signal characteristics introduced by the read element include a first pair of echoes, and wherein the particular set of distortion signatures correctable by the MRAC block is characterized by a second pair of echoes with an amplitude ratio satisfying predefined criteria.

3. The method of claim 2, wherein the non-linear signal characteristic introduced by the write precompensation block combines with one of the echoes introduced by the read element to modify an amplitude ratio of echoes in a Volterra model of a resulting signal input to the MRAC block, the modified amplitude ratio satisfying the predefined criteria such that the echoes are substantially removable by the MRAC block.

4. The method of claim 1, further comprising:
   performing a calibration to select the magnitude of the shift applied by the write precompensation circuit, the calibration providing for:
   selectively incrementing the select magnitude of the shift through each value of a range of values;
   for each value within the range, determining a difference between an output of the read element and a response of a reference system; and
   selecting the magnitude of the shift to equal a select value within the range of values that minimizes the difference.

5. The method of claim 4, further comprising:
measuring an amplitude ratio of a pair of echoes present in the read signal that has been transmitted through the MRAC block; and
selecting the range of values for the calibration based on the measured amplitude ratio.

6. The method of claim 1, further comprising:
measuring an amplitude ratio of a pair of echoes in a Volterra model of a read signal, the echoes being introduced by the read element;
determining whether the measured amplitude radio is a ratio that is correctable by the MRAC block;
responsive to determining that the measured amplitude radio is not correctable by the MRAC block, performing a calibration to select the magnitude of the shift applied by the write precompensation circuit; and
configuring the write precompensation circuit to apply the shift.

7. The method of claim 1, further comprising:
measuring non-linear signal characteristics of a read signal after the storage device has been deployed for use in-the-field; and
dynamically updating the select magnitude of the shift applied by the write precompensation block responsive to the measurement.

8. The method of claim 1, wherein the MRAC block subtracts from the read signal a signal proportional to a square of the read signal.

9. A read/write channel in a storage device comprising:
a write precompensation circuit that receives a write signal from a host device and that shifts rising edges and falling edges of each of pulse in the write signal by a select magnitude and in opposite directions; and
a magnetoresistive asymmetry compensation (MRAC) block that receives, from a read element, a read signal corresponding to the write signal, the MRAC block being tuned to correct second-order non-linearities characterized by a particular set of distortion signatures, wherein the select magnitude of the shift applied by the write precompensation circuit introduces a non-linear signal characteristic that combines with non-linear signal characteristics introduced by the read element to generate one of the particular distortion signatures that is correctable by the MRAC block.

10. The read/write channel of claim 9, wherein the non-linear signal characteristics introduced by the read element include a first pair of echoes, and wherein the particular set of distortion signatures correctable by the MRAC block is characterized by a second pair of echoes with an amplitude ratio satisfying predefined criteria.

11. The read/write channel of claim 10, wherein the non-linear signal characteristic introduced by the write precompensation block combines with one of the echoes introduced by the read element to modify an amplitude ratio of echoes in a Volterra model of a resulting signal input to the MRAC block, the modified amplitude ratio satisfying the predefined criteria such that the echoes are substantially removable by the MRAC block.

12. The read/write channel of claim 9, wherein the select magnitude of the shifts is selected to minimize a difference between an output of the read element and a response of a reference system.

13. The read/write channel of claim 9, wherein the set of distortion signatures correctable by the MRAC block are characterized by a set different of amplitude ratios associated with two echoes that appear in a Volterra model of the read signal and wherein the select magnitude of the shift applied by the write precompensation circuit introduces an amplitude shift in a preidentified one of the two echoes without substantially altering amplitude of a second echo of the two echoes.

14. The read/write channel of claim 9, wherein the MRAC block subtracts from the read signal a signal proportional to a square of the read signal.

15. One or more computer-readable storage media encoding computer-executable instructions for executing a computer process that reduces distortion in a signal read from a storage device, the computer process comprising:
transmitting a write signal through a write precompensation circuit that shifts rising edges and falling edges of each pulse in the write signal by a select magnitude and in opposite directions;
reading a read signal back from the media with a read element; and
transmitting the read signal through a magnetoresistive asymmetry compensation (MRAC) block, the MRAC block being tuned to correct second-order non-linearities characterized by a particular set of distortion signatures, wherein the select magnitude of the shift applied by the write precompensation circuit introduces a non-linear signal characteristic that combines with non-linear signal characteristics introduced by the read element to generate one of the particular distortion signatures that is correctable by the MRAC block.

16. The one or more computer-readable storage media of claim 15, wherein the non-linear signal characteristics introduced by the read element include a first pair of echoes, and wherein the particular set of distortion signatures correctable by the MRAC block is characterized by a second pair of echoes with an amplitude ratio satisfying predefined criteria.

17. The one or more computer-readable storage media of claim 16, wherein the non-linear signal characteristic introduced by the write precompensation block combines with one of the echoes introduced by the read element to modify an amplitude ratio of echoes that appear in a Volterra model of a resulting signal input to the MRAC block, the modified amplitude ratio satisfying the predefined criteria such that the echoes are substantially removable by the MRAC block.

18. The one or more computer-readable storage media of claim 16, wherein the computer process further comprises:
measuring non-linear signal characteristics of a read signal after the storage device has been deployed for use in-the-field; and
dynamically updating the select magnitude of the shift applied by the write precompensation block responsive to the measurement.

19. The one or more computer-readable storage media of claim 15, wherein the MRAC block subtracts from the read signal a signal proportional to a square of the read signal.

20. The one or more computer-readable storage media of claim 15, wherein the non-linear signal characteristic introduced by the write precompensation block changes amplitude of an echo in the read signal such that resulting characteristics of the read signal more closely resemble a second-order system.

\* \* \* \* \*